(12) United States Patent
Nieminen et al.

(10) Patent No.: US 12,214,257 B2
(45) Date of Patent: Feb. 4, 2025

(54) METHOD AND SYSTEM FOR TRACKING PERFORMANCE OF A PLAYER

(71) Applicant: Sstatzz Oy, Helsinki (FI)

(72) Inventors: Tuukka Nieminen, Espoo (FI); Jirka Porupudas, Helsinki (FI); Harri Hohteri, Helsinki (FI)

(73) Assignee: Sstatzz Oy, Helsinki (FI)

( * ) Notice: Subject to any disclaimer, the term of this patent is extended or adjusted under 35 U.S.C. 154(b) by 196 days.

(21) Appl. No.: 17/877,030

(22) Filed: Jul. 29, 2022

(65) Prior Publication Data
US 2022/0387854 A1 Dec. 8, 2022

Related U.S. Application Data

(63) Continuation-in-part of application No. 16/722,145, filed on Dec. 20, 2019, now Pat. No. 11,435,376,
(Continued)

(51) Int. Cl.
*A63B 24/00* (2006.01)
*A63B 43/00* (2006.01)
*A63B 69/00* (2006.01)

(52) U.S. Cl.
CPC ...... *A63B 24/0062* (2013.01); *A63B 24/0021* (2013.01); *A63B 43/004* (2013.01);
(Continued)

(58) Field of Classification Search
CPC ............ G01C 21/08; G01C 21/20; G01P 3/00
See application file for complete search history.

(56) References Cited

U.S. PATENT DOCUMENTS 5,432,699 A 7/1995 Hache et al.
7,171,331 B2 * 1/2007 Vock ......................... G01P 3/00
702/160
(Continued)

FOREIGN PATENT DOCUMENTS

CN 104697485 A 6/2015
DE 102010001058 A1 7/2011

OTHER PUBLICATIONS

China National Intellectual Property Administration, Second Office Action, Application No. 202010599766.1, Mailed Aug. 4, 2024, 7 pages.

*Primary Examiner* — Jermele M Hollington
*Assistant Examiner* — Temilade S Rhodes-Vivour
(74) *Attorney, Agent, or Firm* — Ziegler IP Law Group LLC.

(57) ABSTRACT

A method for tracking performance of player including determining global direction of magnetic field at first court and computing first court specific data; providing rotation for rotating apparatus about spin axis via player, wherein rotating apparatus comprising XYZ-magnetic field sensor; measuring plurality of magnetic field values as function of time when rotating apparatus is rotating about spin axis; computing magnetic field component of magnetic field in direction of local body co-ordinate of spin axis of rotating apparatus; determining direction of spin axis using computed magnetic field component of magnetic field and determined global direction of magnetic field; determining player specific data comprising angle of spin axis with respect to horizontal ground plane and angle of shot direction with respect to horizontal component of spin axis; and calibrating and storing first court specific data and player specific data to track performance of player at first court.

6 Claims, 7 Drawing Sheets

Related U.S. Application Data which is a continuation-in-part of application No. 16/456,089, filed on Jun. 28, 2019, now Pat. No. 11,118,893.

(52) U.S. Cl.
CPC .. *A63B 69/0071* (2013.01); *A63B 2024/0031* (2013.01); *A63B 2024/0034* (2013.01); *A63B 2024/004* (2013.01); *A63B 2024/0056* (2013.01); *A63B 2209/08* (2013.01); *A63B 2220/16* (2013.01); *A63B 2220/20* (2013.01); *A63B 2220/35* (2013.01); *A63B 2220/833* (2013.01); *A63B 2225/02* (2013.01)

(56) References Cited

U.S. PATENT DOCUMENTS

| | | | |
|---|---|---|---|
| 2002/0133958 A1 | 9/2002 | Noureldin et al. | |
| 2013/0018494 A1* | 1/2013 | Amini | A63B 24/0006 |
| | | | 700/91 |
| 2013/0274040 A1* | 10/2013 | Coza | A63B 43/004 |
| | | | 473/570 |
| 2013/0274587 A1* | 10/2013 | Coza | G16H 40/67 |
| | | | 600/595 |
| 2016/0198300 A1* | 7/2016 | Rothschild | H04W 4/021 |
| | | | 455/456.3 |
| 2016/0231138 A1* | 8/2016 | Roberts-Thomson | |
| | | | G01C 19/00 |

* cited by examiner

METHOD AND SYSTEM FOR TRACKING PERFORMANCE OF A PLAYER

CROSS REFERENCE TO RELATED APPLICATION

This application is a continuation-in-part of U.S. patent application Ser. No. 16/456,089 filed Jun. 28, 2019. The said application is incorporated by reference herein.

TECHNICAL FIELD

The aspects of the disclosed embodiment generally relate to a method and a system for tracking performance of a player. Moreover, the aforesaid method and the system, when in operation, determines a location of a rotating apparatus relative to a specified target.

BACKGROUND

It is important to track the movement of one or more projectiles, also referred to herein as a rotating apparatus, such as for example one or more balls, utilized when playing a sports game, for example football or basketball, to determine statistical information relating to the sports game. Such statistical information can include the number of goals or points scored, shots taken, passes made, as well as a performance of one or more players of the sports game. Such tracking has often been implemented using cameras, personnel collating statistics manually as well as using sensors include ed in the one or more projectiles. However, known approaches for analyzing movement of the one or more projectiles are not well developed, such that adequate analysis of sports games utilizing the one or more projectiles is not presently achievable.

One of the problems in tracking the movement of a projectile is the difficultly in determining a direction at or in which a projectile is heading along its trajectory. The direction of the projectile is essential in order to analyze, for example, how a basketball was shot. The direction measurement can be done in theory, for example with use of a location beacon setup (i.e. triangulation or trilateration). Problem with such setup is that it requires beacons and is thus expensive and complex. In addition to the direction a location of a projectiles is of interest in many applications. For example, when analyzing a game location information of a projectile before and after a shot or kick is needed to know. The location of the projectile has been measured using beacon-based location systems. Such systems are expensive and complex.

Furthermore, the direction measurement could be done with use of an electronic-compass. However, the e-compass cannot be used to determine the direction of a trajectory as it only indicates the direction of the magnetic field in respect to the compass. There is no information on which way the projectile having the e-compass is moving. As an example, the e-compass might indicate that the left side of the projectile is facing north but the projectile itself is moving east. Due to the arbitrary orientation of the projectile with respect to the trajectory, the e-compass is not capable to track properties of the trajectory in which we are interested.

Additional problem related to measuring properties of projectile which has been thrown/ejected to the ballistic trajectory is to determine how fast the projectile is spinning (i.e. a spin rate) and also what is the tilt angle between the spin axis and the ground. The spin rate is an important parameter to analyze how the projectile is handled. For example, when making a shot with a basketball, an ideal spin rate is about three revolutions per second. In another example, when trying to kick a soccer ball in a curved way, a non-zero spin rate is required to make the shot curve.

The spin axis measurement is important, for example, in case of basketball. If the spin axis is not parallel to a playing field, then the basketball may bounce in unfavorable manner when the basketball hits a rim. Also, a horizontal spin axis assures that the Magnus effect increases the ball entry angle, therefore making the basket to appear larger.

Further, existing systems that track the movement, location or spin rate of the projectile consume more power, as they have multiple sensors and those multiple sensors are on all the time. Some of the systems, as discussed require also external beacons.

Therefore, considering the foregoing discussion, there exists a need to address the aforementioned drawbacks in determining a direction in which the projectile is heading. In particular, the problem addressed by the aspects of the disclosed embodiments is related to determining a direction of a spin axis of a spherical object, projectile or ball. Furthermore, the present disclosure provides improved method for determining a location of a projectile.

Embodiments of the present disclosure substantially eliminate or at least partially address the aforementioned drawbacks in determining the direction of the spin axis of the rotating apparatus.

SUMMARY

According to a first aspect, the present disclosure provides a method for tracking performance of a player.

In one embodiment, the method comprises:
determining a global direction of a magnetic field at a first court and computing a first court specific data comprising a horizontal direction of a local magnetic field with respect to an x-axis of the global direction of the magnetic field and a vertical direction of the local magnetic field with respect to a local horizontal plane;
providing a rotation for a rotating apparatus about a spin axis via a player, wherein the rotating apparatus comprising a XYZ-magnetic field sensor;
determining that the rotating apparatus is in a ballistic trajectory and activating the XYZ magnetic field sensor;
measuring a plurality of magnetic field values as a function of time with the XYZ-magnetic field sensor when the rotating apparatus is rotating about the spin axis;
computing a magnetic field component of the magnetic field in a direction of a local body co-ordinate of the spin axis of the rotating apparatus from the measured plurality of magnetic field values;
determining a direction of the spin axis using the computed magnetic field component of the magnetic field and the determined global direction of the magnetic field;
determining a player specific data comprising an angle of the spin axis with respect to the horizontal ground plane and an angle of the shot direction with respect to the horizontal component of spin axis; and
calibrating and storing the first court specific data and the player specific data to track the performance of the player at the first court.

Optionally, in the method, tracking the performance of a player further comprises:

determining a global direction of a magnetic field at a second court and computing a second court specific data comprising a horizontal direction of a local magnetic field with respect to an x-axis of the global direction of the magnetic field and a vertical direction of the local magnetic field with respect to a local horizontal plane; and calibrating and storing the second court specific data and the stored player specific data to track the performance of the player at the second court.

Optionally, in the method, the angle of the spin axis with respect to the horizontal ground plane is zero degrees and the angle of the shot direction with respect to the horizontal component of spin axis is 90 degrees.

Optionally, the method further comprises:

estimating a horizontal displacement of the rotating apparatus using at least one of a flight time, a release speed, an initial height, and a height of the rotating apparatus in respect to ground; and determining a location of the rotating apparatus relative to a specified target by combining the direction of the spin axis of the rotating apparatus with the horizontal displacement.

According to a second aspect, the present disclosure provides a system for tracking performance of a player, the system comprising:

a rotating apparatus configured to be provided a rotation about the spin axis via a player, wherein the rotating apparatus comprising:
a communication module; and
a XYZ-magnetic field sensor configured to measure a plurality of magnetic field values as a function of time with the XYZ-magnetic field sensor when the rotating apparatus is rotating about the spin axis; and a processor communicably coupled to the rotating apparatus, wherein the processor configured to:
determine a global direction of a magnetic field at a first court and compute first court specific data comprising a horizontal direction of a local magnetic field with respect to an x-axis of the global direction of the magnetic field and a vertical direction of the local magnetic field with respect to a local horizontal plane;
determine that the rotating apparatus is in a ballistic trajectory and activate the XYZ magnetic field sensor;
compute a magnetic field component of the magnetic field in a direction of a local body co-ordinate of the spin axis of the rotating apparatus from the measured plurality of magnetic field values;
determine a direction of the spin axis using the computed magnetic field component of the magnetic field and the determined global direction of the magnetic field;
determine a player specific data comprising an angle of the spin axis with respect to the horizontal ground plane and an angle of the shot direction with respect to the horizontal component of spin axis for each of the player; and
calibrate and store the first court specific data and the player specific data to track the performance of the player at the first court.

Optionally, in the system, the processor is further configured to:
determine a global direction of a magnetic field at a second court and compute a second court specific data comprising a horizontal direction of a local magnetic field with respect to an x-axis of the global direction of the magnetic field and a vertical direction of the local magnetic field with respect to a local horizontal plane; and calibrate and store the second court specific data and the stored player specific data to track the performance of the player at the second court.

Optionally, in the system, the angle of the spin axis with respect to the horizontal ground plane is zero degrees and the angle of the shot direction with respect to the horizontal component of spin axis is 90 degrees.

Optionally, in the system, the processor is further configured:

estimate a horizontal displacement of the rotating apparatus using at least one of a flight time, a release speed, an initial height, and a height of the rotating apparatus in respect to ground; and determine a location of the rotating apparatus relative to a specified target by combining the direction of the spin axis of the rotating apparatus with the horizontal displacement.

It will be appreciated that features of the aspects of the disclosed embodiments are susceptible to being combined in various combinations without departing from the scope of the disclosed embodiments as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1A:
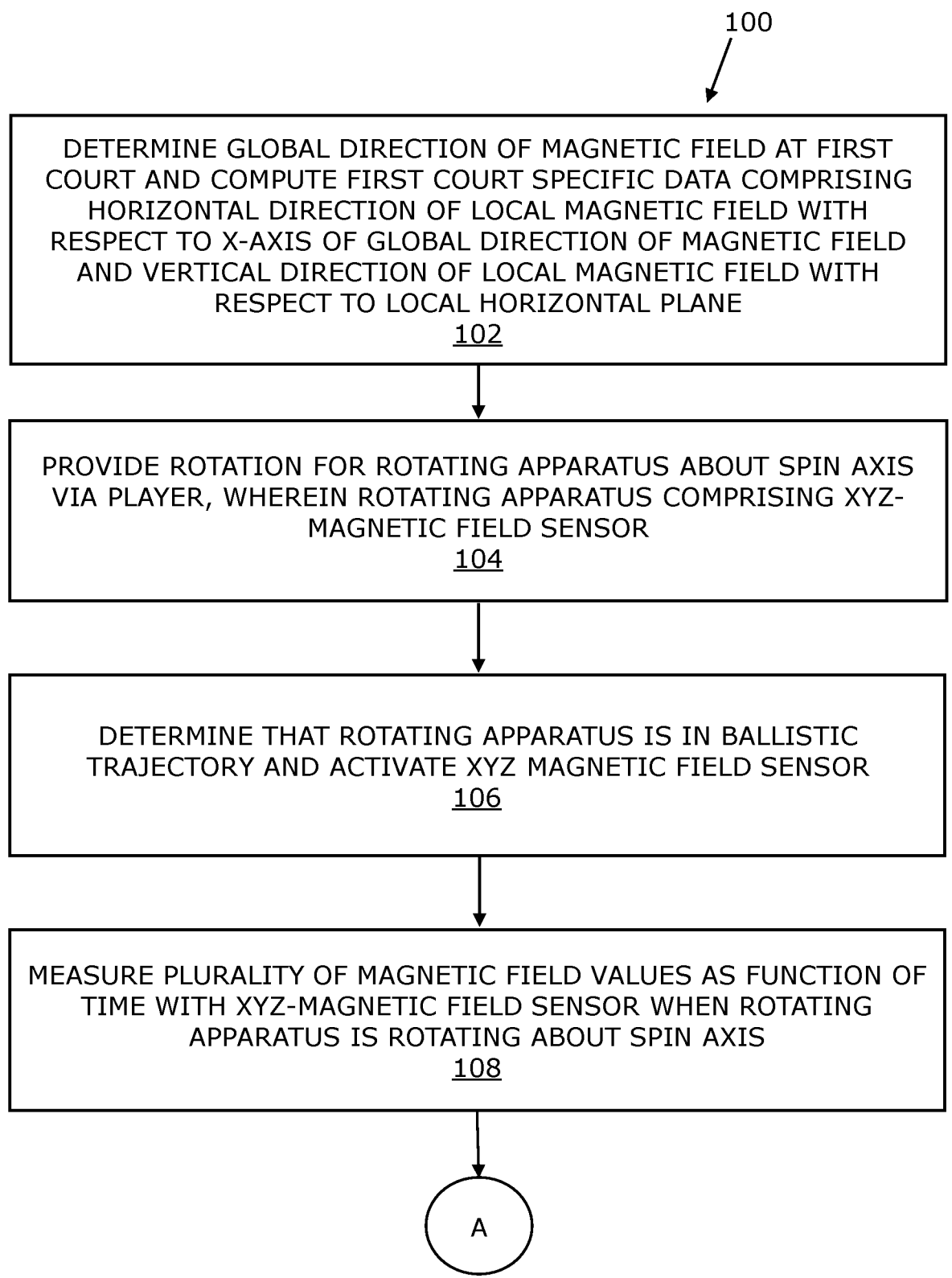
FIGS. 1A and 1B are flowcharts illustrating steps of a method for tracking performance of a player, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

The present disclosure provides a method for tracking performance of a player, the method comprising:
determining a global direction of a magnetic field at a first court and computing a first court specific data comprising a horizontal direction of a local magnetic field with respect to an x-axis of the global direction of the magnetic field and a vertical direction of the local magnetic field with respect to a local horizontal plane;
providing a rotation for a rotating apparatus about a spin axis via a player, wherein the rotating apparatus comprising a XYZ-magnetic field sensor;
determining that the rotating apparatus is in a ballistic trajectory and activating the XYZ magnetic field sensor;
measuring a plurality of magnetic field values as a function of time with the XYZ-magnetic field sensor when the rotating apparatus is rotating about the spin axis;
computing a magnetic field component of the magnetic field in a direction of a local body co-ordinate of the spin axis of the rotating apparatus from the measured plurality of magnetic field values;
determining a direction of the spin axis using the computed magnetic field component of the magnetic field and the determined global direction of the magnetic field;
determining a player specific data comprising an angle of the spin axis with respect to the horizontal ground plane and an angle of the shot direction with respect to the horizontal component of spin axis; and
calibrating and storing the first court specific data and the player specific data to track the performance of the player at the first court.

In another aspect, the present disclosure provides a system for tracking performance of a player, the system comprising:
a rotating apparatus configured to be provided a rotation about the spin axis via a player, wherein the rotating apparatus comprising:
  a communication module; and
  a XYZ-magnetic field sensor configured to measure a plurality of magnetic field values as a function of time with the XYZ-magnetic field sensor when the rotating apparatus is rotating about the spin axis; and
a processor communicably coupled to the rotating apparatus, wherein the processor configured to:
  determine a global direction of a magnetic field at a first court and compute first court specific data comprising a horizontal direction of a local magnetic field with respect to an x-axis of the global direction of the magnetic field and a vertical direction of the local magnetic field with respect to a local horizontal plane;
  determine that the rotating apparatus is in a ballistic trajectory and activate the XYZ magnetic field sensor;
  compute a magnetic field component of the magnetic field in a direction of a local body co-ordinate of the spin axis of the rotating apparatus from the measured plurality of magnetic field values;
  determine a direction of the spin axis using the computed magnetic field component of the magnetic field and the determined global direction of the magnetic field;
  determine a player specific data comprising an angle of the spin axis with respect to the horizontal ground plane and an angle of the shot direction with respect to the horizontal component of spin axis for each of the player; and
  calibrate and store the first court specific data and the player specific data to track the performance of the player at the first court.

The present method thus tracks the performance of a player. Herein, "tracking the performance" refers to analysis of various attributes of a rotating apparatus that are affected by how a particular player performs while playing a sport. The rotating apparatus can be for example an object or projectile such as a basketball, a football, a volleyball, a baseball, bowling, lacrosse ball, a handball, soccer ball, tennis ball, ice hockey puck, javelin etc. In general, the rotating apparatus term refers to an object which, when in use, has a rotating movement or has tendency to have a rotating movement. In this regard, for tracking the performance of the player, the method determines the direction of the spin axis of the rotating apparatus and the location of the rotating apparatus.

According to the present disclosure the rotating apparatus is provided with a rotation around the spin axis. As an example, when a basketball is thrown it typically rotates due to a spin caused by a hand of the player (i.e. basketball is then a rotating apparatus). In a method a rotation is provided for the rotating apparatus about the spin axis. The spin axis is defined along a line including points in a three-dimensional space which remain fixed during the rotation of the rotating apparatus. In essence the term "spin axis" thus refers to a geometrical line about which the rotating apparatus is rotating. The spin axis remains fixed in a local frame of reference in comparison to the rotating apparatus.

An additional example of rotating apparatus is a javelin. As the javelin is thrown it tends to rotate along its longest axis. A further example of a rotating apparatus is a hockey puck. As the puck is shot or passed, there will be a tendency for the puck to lift off the ice and "fly" in the air. It is not uncommon for the moving puck to also rotate as well. Furthermore, the rotation can also take place for a hockey puck also when it is sliding in top of ice.

As one more example of a rotating apparatus is a football. As the football is provided with rotation it might roll on a football field (during rolling it rotates).

A global direction of the magnetic field at a first court is determined. The global direction refers to for example a direction towards magnetic North pole at the first court i.e., a specific court, a field or a track at which the performance of the player are tracked. This direction can be determined using for example an external apparatus such as e-compass of a smart phone or it can be determined for each location where the rotating apparatus is used. As an example, a global direction of the magnetic field in respect to a basketball court might be defined with a map.

In one embodiment, the rotating apparatus includes one or more magnetic field sensors. In an embodiment, the one or more magnetic field sensors are attached or arranged inside (i.e. an inner surface) the rotating apparatus. The one or more magnetic field sensors are configured to measure magnetic field values in X, Y and Z directions. In an embodiment, the one or more magnetic field sensors, without limitation, may be selected from triaxial magnetometers. In an embodiment, the magnetic field sensor comprises three separate sensor elements arranged orthogonally in respect to each other to form the XYZ-magnetic field sensor. In an embodiment, each magnetic field sensor is configured to measure a value of the magnetic field as a function of time, for example, each magnetic field sensor optionally provides a value related to the magnetic field strength for every 0.1 seconds. The magnetic field sensor optionally provides a value related to the magnetic field strength for every 1 seconds or 10 seconds. In an embodiment, each magnetic field sensor is individually calibrated to remove most significant error sources.

The XYZ-magnetic field sensor of the rotating apparatus measures a plurality of magnetic field values as a function of time when the rotating apparatus is rotating about the spin axis. The measured plurality of magnetic field values are used to compute a magnetic field component of the magnetic field in a direction of a local body co-ordinate of the spin axis of the rotating apparatus.

A direction of the spin axis is determined using the computed magnetic field components of the magnetic field and the determined global direction of the magnetic field.

According to an embodiment computing and determining are performed with a processor. Furthermore, measurement and/or collecting measurement results from the XYZ-magnetic field sensor can be performed with the processor. The processor might be a computing unit arranged inside of the rotating apparatus. Alternatively, the processor can be external to the rotating apparatus (and communicate wirelessly), without limitation, and the processor may be selected from a mobile phone, a smart telephone, a Mobile Internet Device (MID), a tablet computer, an Ultra-Mobile Personal Computer (UMPC), a phablet computer, a Personal Digital Assistant (PDA), a web pad, a handheld Personal Computer (PC), and a laptop computer. The processor optionally communicates with a server through a network. In an embodiment, the network is a wired network, a wireless network, or a combination of a wired network and a wireless network. In an embodiment, the network is the Internet. In further example part of the functionality of the processor can be arranged inside of the rotating apparatus (as form of microcontroller) and part outside (as form of smart phone connected via wireless connection, such as Bluetooth, to the microcontroller).

The processor determines the direction of the spin axis using the computed magnetic field component of the magnetic field and the determined global direction of the magnetic field. The determined direction of the spin axis can be used to analyze which direction (i.e. heading) the rotating apparatus is moving in along its trajectory. As an example, the direction of the spin axis can be used to determine that a ball is heading (during a shot) towards East or for example, at an angle of 45 degrees in respect to a basketball court or other playing field.

In one example embodiment, in the game of basketball, the ball is the rotating apparatus and such a quantity may be an angle between the spin axis of the ball and a horizontal plane, where a nonzero angle indicates a problem in a shooting technique of a player. In another example embodiment, in the game of football where the football is the rotating apparatus, the spin axis of the football is exploited to determine a change in a direction of the trajectory of the football and the direction of the spin axis of the football in the surrounding, which are key parameters in computing an overall shape of a realized trajectory of the football.

In an embodiment, the global magnetic field is the earth's magnetic field surrounding the rotating apparatus which is homogenic. The magnetic field will be essentially constant if the rotating apparatus is located in at least one of (i) an indoor environment or (ii) an outdoor environment.

Moreover, the method comprises computing a first court specific data comprising of a horizontal direction of a local magnetic field with respect to an x-axis of the global direction of the magnetic field and a vertical direction of the local magnetic field with respect to a local horizontal plane. Herein, the magnitude of the magnetic field is arbitrary, and the magnetic field for any single basket is characterized by parameters such magAz (which is a horizontal direction of surrounding magnetic field with respect to an x-axis of a selected global reference frame), and magEle (which is a vertical direction of the magnetic field or an inclination angle of the magnetic field with respect to a local horizontal plane). Herein, the magAz and magEle are court specific data i.e., the value of the magAz and magEle varies from one court to another. Subsequently, the first court specific data refers to the value of the magAz and the magEle specific to the first court. The normalized magnetic field i.e. with unit magnitude for any single basket is expressed in a form as follows:

$$B = \begin{bmatrix} \cos(magEle)\cos(magAz) \\ \cos(magEle)\sin(magAz) \\ -\sin(magEle) \end{bmatrix}$$

As an example, in the game of basketball using a right-handed coordinate system, x points towards the basket along the sidelines of a court; y points to right and is orthogonal to the sidelines and z points vertically down. In an embodiment, the global reference frame specified in this way is called a court frame.

In an embodiment, the goal structures, such as the baskets, which are typically metal. Occasionally the ground plane may introduce local disturbances to the magnetic field, but the homogeneity assumption is typically valid whenever the basketball is thrown or otherwise flying in the air.

The spin axis represented in the local reference frame is constant during any period of time including unobstructed and unforced movement of the rotating apparatus such as a flight of the rotating apparatus in air or a slide of a puck on ice. In an embodiment, a constant spin axis in the local reference frame does imply the constant spin axis in the global reference frame. Even though, the spin axis is constant, an angular velocity about that spin axis need not be constant.

In an example embodiment the spin axis is determined by finding a direction that minimizes a variance of the measured plurality of magnetic field values. This found direction that minimizes a variance of the measured plurality of magnetic field values (minimum variance solution) might have two possible solutions (negative and positive i.e. there is a sign ambiguity related to the solution). The solution is further analyzed to resolve a sign ambiguity related to the found minimum variance solution by comparing two consecutively measured magnetic field values of the measured plurality of magnetic field values with each other.

In an embodiment, the found axis is used to perform a basis transformation into a basis where one of the axes is aligned with the spin axis. The found direction that minimized a variance of the measured plurality of magnetic field values and the resolved sign is used as a direction of the spin axis.

Denoting a real-valued N×3 matrix that includes the measured plurality of magnetic field values during a time period of interest by M. The spin axis is determined by employing a new orthogonal and right-handed basis for the measured plurality of magnetic field values, such that the variance of the measured plurality of magnetic field values in a direction of at least one basis vector is minimized. In an embodiment, the basis vector with the minimal variance including only noise and some variations of the magnetic field is determined as the spin axis. The spin axis represented in the local reference frame is determined as a solution of an optimization problem:

$$\pm s_a = \operatorname{argmin}^n{}_{w \in \mathbb{R}^3} \operatorname{var}(Mw) \text{ such that } w^T w = 1,$$

which accounts for determining a linear combination of the three orthogonal axes minimizing the variance of the measured plurality of magnetic field values in a direction of unit vector (w). In an embodiment, the sign ambiguity follows as the variance is always positive. The optimization problem presented above is equivalently presented as:

$$\pm \begin{bmatrix} \alpha_{sa} \\ \beta_{sa} \end{bmatrix} = \operatorname{argmin}_{\alpha,\beta \in \mathbb{R}} \operatorname{var}\left( M \begin{bmatrix} \cos\alpha\cos\beta \\ \cos\alpha\sin\beta \\ \sin\alpha \end{bmatrix} \right),$$

where the unit constraint is a feature of a selected parametrization. In an embodiment, the minimization problem above is presented as a variance maximization problem with the aim to determine an axis orthogonal to the spin axis.

The optimization problem is solved up to the sign ambiguity with any optimization routine starting from an arbitrary initial guess which leads to one of the two optima. Additionally, a specific initial guess for an optimization algorithm is obtained by resolving a singular value decomposition using an equation as follows:

$$U\Sigma V^T = \operatorname{svd}(M),$$

and choosing a right singular vector $v_i$ (a column of V) with smallest var $(Mv_i)$. This is equivalent to resolving V as eigenvectors of a normal matrix $M^T M$. In an embodiment, the selected $v_i$ may yield an estimate of the spin axis on its own, but typically the most accurate estimates of the spin axis are obtained as a solution of a presented variance minimization problem.

In an embodiment, determining the spin axis of the rotating apparatus results in two potential solutions for the spin axis corresponding to alternative shot directions due to the sign ambiguity. The sign ambiguity is solved by analysis of the gathered data (i.e. the plurality of magnetic fields). In an embodiment, the observed magnetic fields are measured at known time intervals and/or at a constant sample rate and are stored in a temporal order.

In an embodiment, the computed magnetic field component of the magnetic field is not a constant. For example, nutation and precession may cause the computed magnetic field component to change as a function of time and the change information is used to obtain further information about trajectory of the rotating apparatus.

In an embodiment, the constructs a dynamic model that represents the rotation of the rotating apparatus. The dynamic model determines a spin rate consistent with the dynamic model and time-dependent data using Rodrigues' rotation formula as follows:

$$C(s_a, \theta) = I_3 \cos\theta + (1 - \cos\theta) s_a s_a^T + [s_a]_x \sin\theta$$

where θ represents a net rotation angle over the spin axis, and $[s_a]_x$ is the skew-symmetric form of $s_a$. With a further assumption of a constant spin rate, $\theta = \omega t$.

The Rodrigues' rotation formula expands to form $$C(\omega t) =$$

$$\begin{bmatrix} (1-\cos(\omega t))s_{a,x}^2 + \cos(\omega t) & (1-\cos(\omega t))s_{a,x}s_{a,y} - s_{a,z}\sin(\omega t) & (1-\cos(\omega t))s_{a,x}s_{a,z} \\ (1-\cos(\omega t))s_{a,y}s_{a,x} + s_{a,z}\sin(\omega t) & (1-\cos(\omega t))s_{a,y}^2 + \cos(\omega t) & (1-\cos(\omega t))s_{a,y}s_{a,z} \\ (1-\cos(\omega t))s_{a,z}s_{a,x} - s_{a,y}\sin(\omega t) & (1-\cos(\omega t))s_{a,z}s_{a,y} + s_{a,x}\sin(\omega t) & (1-\cos(\omega t))s_{a,z}^2 \end{bmatrix},$$

which is used to couple any pair of sample triplets $m_i$, $m_j$ as follows:

$$m_j = C(w(t_j - t_i)) \dot{m}_i$$

From this, after algebraic manipulation, three equations of the general form are obtained for each pair of sample triplets with values as follows:

$$a\cos(\omega t) + b\sin(\omega t) + c = 0$$

$$a = \begin{cases} (1 - s_{a,x}^2)m_{i,x} - s_{a,x}s_{a,y}m_{i,y} - s_{a,x}s_{a,z}m_{i,z} \\ (1 - s_{a,y}^2)m_{i,y} - s_{a,y}s_{a,x}m_{i,x} - s_{a,y}s_{a,z}m_{i,z} \\ (1 - s_{a,z}^2)m_{i,z} - s_{a,z}s_{a,x}m_{i,x} - s_{a,z}s_{a,y}m_{i,y} \end{cases}$$

$$b = \begin{cases} s_{a,y}m_{i,z} - s_{a,z}m_{i,y} \\ s_{a,z}m_{i,x} - s_{a,x}m_{i,z} \\ s_{a,x}m_{i,y} - s_{a,y}m_{i,x} \end{cases}$$

$$c = \begin{cases} s_{a,x}^2 m_{i,x} + s_{a,x}s_{a,y}m_{i,y} + s_{a,x}s_{a,z}m_{i,z} - m_{j,x} \\ s_{a,y}^2 m_{i,y} + s_{a,y}s_{a,x}m_{i,x} + s_{a,y}s_{a,z}m_{i,z} - m_{j,y} \\ s_{a,z}^2 m_{i,z} + s_{a,z}s_{a,x}m_{i,x} + s_{a,z}s_{a,y}m_{i,y} - m_{j,z} \end{cases}$$

The multiples of π, are neglected and this kind of equation may include up to two unique results:

$$\omega = \frac{2}{t_j - t_i} \tan^{-1} \frac{b \pm \sqrt{a^2 + b^2 - c^2}}{a - c}$$

However, only one result of which provides consistent values for ω over different axes and sample triplets $m_i$, $m_j$. In an embodiment, a pair of observed magnetic field may lead to a negative discriminant $(a^2 + b^2 - c^2)$ and therefore lead to imaginary results.

In an embodiment, if an average of a consistent spin rate estimate is positive, the direction of the spin axis obtained above is correct. In another embodiment, if the average of the consistent spin rate is negative, the direction of the obtained spin axis may be reversed.

The processor optionally estimates components of the surrounding homogenic magnetic field in the direction of the spin axis $s_a$ by its average value when the rotating apparatus rotates about a constant axis in the homogenic magnetic field. The average value is calculated using an equation as follows:

$$b_{sa} = \frac{1}{N}\sum_{i=1}^{N}(Ms_a)_i$$

In an embodiment, the rotation of the rotating apparatus is modeled as the rotation that takes place over a single spin axis of the rotating apparatus and is constant but arbitrary. In an embodiment, $b_{sa}$ is independent of the magnetic field direction.

In an embodiment, the processor estimates $b_{sa}$ by modeling the measured plurality of magnetic field values with a minimalistic three-parameter model which ensures that the norm is constant throughout a time period of interest. Initially, a basis for the measured plurality of magnetic field values where one of the axes is the spin axis $s_a$ is generated. For, given parameters $\alpha_{sa}$ and $\beta_{sa}$, from the solution of the optimization problem, the basis for the measured plurality of magnetic field values is defined by matrix:

$$V = \begin{bmatrix} -\sin\alpha_{sa}\cos\beta_{sa} & -\sin\alpha_{sa}\sin\beta_{sa} & \cos\alpha_{sa} \\ \cos\alpha_{sa}\cos\beta_{sa} & \cos\alpha_{sa}\sin\beta_{sa} & \sin\alpha_{sa} \\ -\sin\beta_{sa} & \cos\beta_{sa} & 0 \end{bmatrix},$$

where the spin axis is in a second row of the matrix, the basis vector of a third row is generated so that it is orthogonal to the spin axis, and the basis vector of a first row so that it is cross product of the second and third row. When transformed into such basis the measured plurality of magnetic field values are modeled with a three degrees of freedom model of the form:

$$Vm(t) \approx f(b_{sa}, \omega, \theta_0) = \begin{bmatrix} \sqrt{1-b_{sa}^2}\sin(\omega t + \theta_0) \\ b_{sa} \\ \sqrt{1-b_{sa}^2}\cos(\omega t + \theta_0) \end{bmatrix}$$

where $\omega$ is the spin rate estimated above and $\theta_0$ represents a phase shift, wherein the phase shift is estimated by:

$$\theta_0 \approx \pi - \frac{1}{N}\sum_{i=1}^{N}[(\pi - atan2(Vm(t_i)_x, Vm(t_i)_z) + \omega t_i)\mod (2\pi)].$$

A signal model is used to bind the uncoupled estimates of parameters $b_{sa}$, $\omega$, and $\theta_0$ together by minimizing:

$$\sum_{i=1}^{N}\left\|\frac{m(t_i)}{\|m(t_i)\|_2} - V^T f(b_{sa}, \omega, \theta_0, t_i)\right\|_2^2,$$

or a similar cost function causing minimalistic three-parameter model $f(b_{sa}, \omega, \theta_0)$ to be as close to the observed data (e.g. magnetic field values) m(t) as possible. Once the cost function is selected, its value is minimized from the initial guess. Further, if the spin axis is horizontal, an alternate approach is the solution of a constrained minimization problem, which causes the minimization problem to yield a solution by:

$|b_{sa}| \leq \cos(magEle)$.

In an embodiment, the estimate of $b_{sa}$ may depend on the magnetic field parameters, and the magnetic poles may include an additional tendency to retrieve all nearby solutions.

In an embodiment, the processor obtains a shot direction by representing the observed magnetic field in a horizontally level, headed towards a basket frame as:

$$b = \begin{bmatrix} \pm\sqrt{1-(b_{sa}-\sin(\alpha)\sin(magEle))^2 - \sin^2(magEle)} \\ b_{sa} - \sin(\alpha)\sin(magEle) \\ \sin(magEle) \end{bmatrix}$$

whenever $1-(b_{sa}-\sin(\alpha)\sin(magEle))^2-(magEle)>0$, where $\alpha$ is the angle between the spin axis and horizontal ground plane. The processor detects that the horizontal component of the spin axis is typically orthogonal to shot direction $$\left(-\frac{\pi}{2} \leq s_d \leq \frac{\pi}{2}\right).$$

This, in the game of basketball example, leads to two solution candidates $$s_d = \begin{cases} \left[\left(\frac{\pi}{2} + magAz + atan2(+b_x, b_y)\right)\mod (2\pi)\right] - \pi \\ \left[\left(\frac{\pi}{2} + magAz + atan2(-b_x, b_y)\right)\mod (2\pi)\right] - \pi \end{cases}.$$

In a further embodiment, the processor detects that angle $\beta$ between the shot direction and the horizontal component of the spin axis may not be equal to $$\pm\frac{\pi}{2},$$

and the angle $\alpha$ between the horizontal ground plane and the spin axis may not be equal to 0. Herein, the processor forms an analytic formula for the component of the magnetic field in the direction of the spin axis $b_{sa}$ as follows:

$$b_{sa} = [\cos\alpha\cos(s_d+\beta)\cos\alpha\sin(s_d+\beta)\sin\alpha]\begin{bmatrix}\cos(magEle)\cos(magAz) \\ \cos(magEle)\sin(magAz) \\ \sin(magEle)\end{bmatrix}$$

The above equation can be simplified in following steps to obtain an equation to determine solutions of shot direction $s_d$. The above equation can be simplified using matrix multiplication to obtain:

$b_{sa}=\cos\alpha \cos(magEle)(\cos(magAz)\cos(s_d+\beta)+\sin(magAz)\sin(s_d+\beta))+\sin(magAz)\sin(magEle)$ Further, using trigonometric identities, $b_{sa}$ can be simplified as:

$b_{sa}=\cos\alpha \cos(magEle)\cos(magAz-s_d-\beta)+\sin(magAz)\sin(magEle)$

The value of $s_d$ can be obtained by further simplifying the above equation as follows:

$$s_d = magAz - \beta - \cos^{-1}\left(\frac{b_{sa} - \sin\alpha\sin(magEle)}{\cos\alpha\cos(magEle)}\right).$$

According to an embodiment, the processor obtains the shot direction by representing the observed magnetic field in an elevated level, headed towards a basket frame as:

$$b = \begin{bmatrix} \pm\sqrt{1 - ([b_{sa} - \sin(\alpha)\sin(magEle)]/\cos(\alpha))^2 - \sin^2(magEle)} \\ [b_{sa} - \sin(\alpha)\sin(magEle)]/\cos(\alpha) \\ \sin(magEle) \end{bmatrix}$$

wherein, $1-([b_{sa}-\sin(\alpha)\sin(magEle)]/\cos(\alpha))^2-\sin^2(magEle)$
$>0,$ Thus, for example, in the game of football, cricket, javelin throw and the like, wherein angle α between the horizontal ground plane and the spin axis is not equal to 0, this leads to two solution candidates, as follows:

$$s_d = \begin{cases} [(magAz + a\tan2(+b_x, b_y) - \beta + \pi) \mod (2\pi)] - \pi \\ [(magAz + a\tan2(-b_x, b_y) - \beta + \pi) \mod (2\pi)] - \pi \end{cases}$$

In an embodiment, the processor resolves the spin axis by employing a model of a form $$\frac{m(t_i)}{\|m(t_i)\|_2} \approx RC\left(-\begin{bmatrix}0\\1\\0\end{bmatrix}, \omega t\right)\begin{bmatrix} \cos s_d & \sin s_d & 0 \\ -\sin s_d & \cos s_d & 0 \\ 0 & 0 & 1 \end{bmatrix}\begin{bmatrix} \cos(magEle)\cos(magAz) \\ \cos(magEle)\sin(magAz) \\ -\sin(magEle) \end{bmatrix},$$

where R is a rotation matrix, C(·,·) represents the Rodrigues' rotation formula as above, co is the spin rate, and θ is the shot direction.

In an embodiment, the processor selects a branch using a first branch selection method. In an embodiment, the processor uses a secondary approach to resolve an orientation of the rotating apparatus when the rotating apparatus is released. In an embodiment, the orientation converts accelerations measured during the release of the rotating apparatus to a co-ordinate system related to for example a basketball court.

In an embodiment, the processor selects the branch using a user device that is communicating with the rotating apparatus through the network. In an embodiment, the user device, without limitation, may be selected from a mobile phone, a Personal Digital Assistant (PDA), a tablet, a desktop computer, or a laptop.

In an embodiment, the processor processes Received Signal Strength Indicator (RSSI) information to estimate a distance between a player and the user device. In an embodiment, the processor selects the branch if a location of the user device is known and a shot distance is estimated.

The processor automatically selects the branch by collecting a number of indicators and employs machine learning techniques. In one example embodiment, a neural network (NN) based classification network that indicates an index of the correct branch or a NN-based function fitting network directly estimates the shot direction. The processor automatizes a process of weighting different estimated shot directions to yield a combined solution, and a possibility to reject inconsistent shot direction estimates and automatically limits the solution into correct interval for maximum robustness.

Moreover, the method comprises determining a player specific data comprising an angle of the spin axis with respect to the horizontal ground plane and an angle of the shot direction with respect to the horizontal component of spin axis. Herein, the angle of the spin axis with respect to the horizontal ground plane refers to a tilt angle, and the angle of the shot direction with respect to the horizontal component of spin axis refers to a yaw angle. In this regard, the tilt angle and the yaw angle are specified under the player specific data, as the player whose performance is being tracked are each having different specific values of the tilt angle and the yaw angle, thus being player specific.

In an embodiment, the angle of the spin axis with respect to the horizontal ground plane is zero degrees and the angle of the shot direction with respect to the horizontal component of spin axis is 90 degrees. However, any deviation in the angle of the shot direction with respect to the horizontal component of the spin axis from 90 degrees is compensated via adjusting the value of magAz and such said deviation is not able to cause any error in calculation.

Furthermore, the method comprises calibrating and storing the first court specific data and the player specific data to track the performance of the player at the first court. Herein, to track the performance of the player, the player specific data for the players is calibrated with the court specific data thus enabling us to track the performance of the plurality of the players on the first court. Herein, the method tracks the direction and trajectory of the rotating apparatus that is released or shot by the player via determining the spin axis of the rotating apparatus, thus allowing the players to make required adjustments in their game by determining and monitoring the factors that affect their performance. Moreover, the first court specific data and the player specific data is stored, thus allowing other players to use the stored data in order to improve their respective game reducing the time that is required for calibrating and tracking their respective performance.

In an embodiment, the method further comprises:
  determining a global direction of a magnetic field at a second court and computing a second court specific data comprising a horizontal direction of a local magnetic field with respect to an x-axis of the global direction of the magnetic field and a vertical direction of the local magnetic field with respect to a local horizontal plane; and
  calibrating and storing the second court specific data and the stored player specific data to track the performance of the player at the second court.

In this regard, for tracking the performance of the player at the second court, the player is not required to again take a large number of shots with the rotating apparatus for the purpose of calibration. Herein, the second court specific data is computed for the second court and subsequently, the second court specific data is calibrated with the already stored player specific data, thus allowing the players to predict and track their performance on the second court and allows the players to make necessary arrangements in their game to improve their performance. Thus, the players are not required to take shots again and again for calibration in order to track their performance at every different court on which they play.

According to an embodiment, determining the direction of the spin axis further comprises determining an angle between the spin axis of the projectile or ball and a horizontal ground plane. The determined angle can be used to refine the determined direction of the spin axis.

Further, according to an embodiment, the processor is configured to determine the overall level of tilt angle when the elevation angle of the magnetic field is known. The tilt angle can be determined as follows:

$$\frac{b_{sa}(\theta, s_d) + b_{sa}(\theta, s_d + \pi)}{2}$$

-continued $$= \frac{1}{2}\cos\alpha\cos(\cos(magEle)\cos(magAz - s_d - \beta)$$
$$+ \frac{1}{2}\cos\alpha\cos(magEle)\cos(magAz - s_d - \beta + \pi)$$
$$+ \sin\alpha\sin(magEle)$$
$$= \sin\alpha\sin(magEle)$$

According to yet another embodiment a horizontal displacement of the rotating apparatus is estimated. The horizontal displacement can be estimated using at least one of a flight time, a release speed, an initial height, and a height of the rotating apparatus in respect to ground. As an example, if a flight time of the ball is 2 second and the speed (release speed can be assumed to be speed if friction is not taken in account) is 3.5 meters per second the horizontal displacement is 7 meters. Further a location of the rotating apparatus relative to a specified target can be determined by combining the direction of the spin axis of the rotating apparatus with the horizontal displacement. An example of a specified target is a basket of a basketball court (having long side in East-West direction). If also as an example the direction of the spin axis has been determined to be North, we can determine that the shot was taken 7 meters from the basket in the direction of the long side (i.e. outside of 3 points line) i.e. where the location of the basketball was when the shot was taken. i.e. assuming that the long side of the court is in the East-West-direction, a spin axis pointing North indicates that the shot was taken in the direction of the long side. This is due to the ~90 degrees of difference between spin axis and shot direction in given example. This location information is useful when analyzing the game. Furthermore, the location can be derived using the method/apparatus without having external beacon or camera etc. systems by this method. In an additional example the direction of the spin axis is determined to be towards East in game of football. The football field is in East-West direction. The ball hits a specific target (and for example detected with an optional accelerometer) of goal. If the horizontal displacement was 30 meters a location where the shot was made can be determined. The present method thus automatically determines a relative location of the rotating apparatus with respect to a specified target.

In the game of football in practical terms the spin axis of a straight shot-generally referred to as a pass or kick in the game of American style football—is rarely horizontal, but closer to the vertical direction, or a combination of horizontal and vertical displacement. In such cases, an angle between the spin axis and the horizontal ground plane can be used to enhance the determination of the location. For a pass/shot rolling and/or bouncing on the ground, the spin axis is closer to a horizontal one.

According to yet another embodiment, the global direction of the magnetic field is determined by ejecting the rotating apparatus for at least one time in a trajectory in a known horizontal direction. As an example, we know that the rotating apparatus is ejected (thrown in an example of a ball) towards North. The known direction of North is provided to the processor. Alternatively, the known direction can be provided to smart phone receiving information from the processor of the rotating apparatus. Furthermore, using at least one of local environment related geographical information can be used.

As an example, if we know the direction of the long side of the basketball court it can be used as information to determine the global direction. Further the global direction can be determined by using a second sensor such as a sensor of a smart phone.

According to yet another embodiment, the method comprises using an accelerometer of the rotating apparatus for detecting if the rotating apparatus is ejected (thrown) on a ballistic trajectory. If the rotating apparatus is detected to be on the ballistic trajectory the XYZ-magnetic field sensor is activated. The present method thus optionally employs an accelerometer that is attached or otherwise secured to the inside of the rotating apparatus.

The accelerometer can be used to detect an acceleration of the rotating apparatus when the rotating apparatus is used. As an example, the accelerometer can detect when the rotating apparatus is on a trajectory. For example, when the rotating apparatus is a ball, when the ball is thrown, the ball will follow a path under the action of the forces from the throwing motion. This throwing motion could also include passing or shooting, for example.

According to an embodiment the accelerometer activates the XYZ-magnetic field sensor if the rotating apparatus is detected to be in the ballistic trajectory, thereby reducing power consumption of the rotating apparatus. As the rotating apparatus is in the ballistic trajectory it is "free fall" state from the accelerator point of view i.e. the accelerometer reading is effectively zero. (or the reading can be used to deduct that the rotating apparatus is in a "free fall state". As a note the accelerometer reading can comprise reading a value arising from or being generated by the rotation as well. This reduces power consumption as the direction of the spin axis is mainly needed when the rotating projectile is thrown in a trajectory such as a ballistic trajectory. This way the spin axis direction can be used for measuring where to projectile (such as a basketball) is being thrown. Alternatively, the accelerometer can detect a movement of the projectile such as a hockey puck and activate the XYZ magnetic field sensor when the movement of the hockey puck is detected.

The optional accelerometer and the XYZ-magnetic field sensor communicate the measured data such as acceleration data and the plurality of magnetic field values of the rotating apparatus to the processor.

According to yet another embodiment, the direction of the spin axis is determined during a time interval when the rotating apparatus is on the ballistic trajectory. This way power consumption of the electronic components of the rotating apparatus can be reduced as the spin axis direction is determined only when the ball is determined to be in a trajectory. The magnetic field sensor can be kept off during other times such as during storage, non-use, or when holding the rotating apparatus in hand.

In an alternative embodiment a direction of a spin axis of a rotating apparatus comprising a XYZ-magnetic field sensor and a gyroscope is determined. First a global direction of a magnetic field is determined. Then a rotation for the rotating apparatus about the spin axis is provided, wherein the spin axis is defined along a line including points in a three-dimensional space which remain fixed during the rotation of the rotating apparatus. At least one magnetic field value with the XYZ-magnetic field sensor is measured when the rotating apparatus is rotating about the spin axis. The gyroscope is used to measure at least one angular speed value and orientation value. A direction of the spin axis is determined using measured at least one magnetic field value, the at least one angular speed value, the orientation value and the determined global direction of the magnetic field.

Gyroscope values can be used to determine spin axis. In this embodiment the angle between the gyroscope and magnetic field sensor is known. Thus, the magnetic field measurement provides information of the direction of the spin axis in respect to the local magnetic field can be determined. This is compared with the global direction to determine the direction of the spin axis.

The direction of the spin axis can be used as discussed earlier to determine for example the location of the rotating apparatus. Furthermore, if the rotating apparatus comprises an accelerometer the accelerometer readings can be used to switch the gyroscope on during the time the rotating apparatus is in a ballistic trajectory to save power.

In an example embodiment, when the rotating apparatus is a football, the plurality of magnetic field values are optionally measured using the XYZ-magnetic field sensor of the football when the football is rolling on the ground. The football is configured with the XYZ-magnetic sensor and optionally the XYZ-magnetic field sensor is configured to switch on only when the football is in the ballistic trajectory (i.e. shot, passed or kicked) or rolling on the ground. By limiting the times when the XYZ-magnetic sensor is used, the power consumption of the electronic components in the football are reduced.

The determined direction of the spin axis of the body can be used for analyzing for example trajectories of the rotating apparatus. This is needed for example many sports activities to provide meaningful statistics or provide feedback on performance of the athletics. In essence the direction of the spin axis can be used as indication of the direction to which the rotating apparatus is going at a given moment of time. The magnetic field sensor (and other components) are arranged inside of the body of the apparatus. As an example, the sensor can be arranged together with other components (such as controller and related battery+communication means and optional accelerometer) in a compact package. The compact package is attached to an inner surface of the body. In case of a basketball the inner surface of the body is same as the inner surface of the ball.

The advantages of the present system are thus identical to those disclosed above in connection with the present method and the embodiments listed above in connection with the present method apply mutatis mutandis to the system.

In an embodiment, the processor is further configured to:
determine a global direction of a magnetic field at a second court and compute a second court specific data comprising a horizontal direction of a local magnetic field with respect to an x-axis of the global direction of the magnetic field and a vertical direction of the local magnetic field with respect to a local horizontal plane; and
calibrate and store the second court specific data and the stored player specific data to track the performance of the player at the second court.

In an embodiment, the angle of the spin axis with respect to the horizontal ground plane is zero degrees and the angle of the shot direction with respect to the horizontal component of spin axis is 90 degrees.

In an embodiment, the processor is further configured to:
estimate a horizontal displacement of the rotating apparatus using at least one of a flight time, a release speed, an initial height, and a height of the rotating apparatus in respect to ground; and
determine a location of the rotating apparatus relative to a specified target by combining the direction of the spin axis of the rotating apparatus with the horizontal displacement.

In an embodiment, the XYZ-magnetic field sensor is a device that detects and measures magnetic flux and/or a strength and a direction of the magnetic field at a particular location. The XYZ-magnetic field sensor is optionally a triaxial magnetometer. In an embodiment, the XYZ-magnetic field sensor is optionally attached to an inner surface of the rotating apparatus. In another embodiment, the XYZ-magnetic field sensor is optionally attached to an outer surface of the rotating apparatus. The rotating apparatus is optionally a basketball that is attached with the XYZ-magnetic field sensor and the processor. The rotating apparatus is optionally a football, soccer ball, baseball, puck or other sports object that includes the XYZ-magnetic field sensor and the processor.

In an embodiment, the rotating apparatus is communicatively connected with a server or a user device through a wired or a wireless network. The server optionally receives the measured plurality of magnetic field values from the rotating apparatus. The server may comprise a processor that determines a direction of the spin axis of the rotating apparatus. In an embodiment, the processor of the server optionally performs one or more steps of the processor. The server optionally comprises a personal computer, a tablet, a laptop or an electronic notebook. The components of the rotating apparatus are in communication via the communication network that is optionally a wired network or a wireless network. The user device optionally comprises a personal computer, a smartphone, a tablet, a laptop or an electronic notebook.

In an embodiment, the rotating apparatus optionally communicates the determined direction of the spin axis to the server. The server stores the determined direction of spin axis in a database. In an embodiment, the server is optionally a cloud service.

According to an embodiment, the rotating apparatus further includes a gyroscope arranged inside of the body of the rotating apparatus.

According to another embodiment, the rotating apparatus further comprises an accelerometer. The accelerometer is arranged inside of the rotating apparatus. As an example, the accelerometer can be embedded in the compact package (as described earlier) which is mounted to inner surface of the body, the accelerometer being configured to provide accelerometer measurements to the processor and the processor is configured to:
detect from the provided accelerometer measurements if the rotating apparatus is ejected on a ballistic trajectory (i.e. passed, thrown or shot); and
provide an activation signal to the XYZ-magnetic field sensor if the rotating apparatus is detected to be in the ballistic trajectory to activate the XYZ-magnetic field sensor to perform magnetic field measurement.

The present disclosure provides a system for determining location of a rotating apparatus, wherein the rotating apparatus configured to
determine a direction of a spin axis of the rotating apparatus;
estimate a horizontal displacement of the rotating apparatus from a place of ejecting the rotating apparatus towards to a specified target; and
provide the determined direction of the spin axis and the estimated horizontal displacement to a portable computing device,
wherein the portable computing device is configured to use the provided direction and displacement values to determine a location of the rotating apparatus in respect to the specified target.

As discussed earlier the location of the rotating apparatus can be used to analyze for example a game of basketball.

The location in said example is location of a ball in respect to target such as basket. As the location in respect to the basket, direction and the basket location is known a user can be provided with rendered view (on a user device) of shots taken during a game or practice.

Embodiments of the present disclosure may determine a direction of the spin axis of the rotating apparatus more accurately. Embodiments of the present disclosure may determine a relative location of the rotating apparatus with respect to a specified target. Embodiments of the present disclosure beneficially reduce the power consumption of the rotating apparatus by switching on the XYZ-magnetic field sensor only when the rotating apparatus is moving along a trajectory. Embodiments of the present disclosure may determine a rotation speed of the rotating apparatus without gyroscope sensors which consume more power.

DETAILED DESCRIPTION OF THE DRAWINGS

Figure 1B:
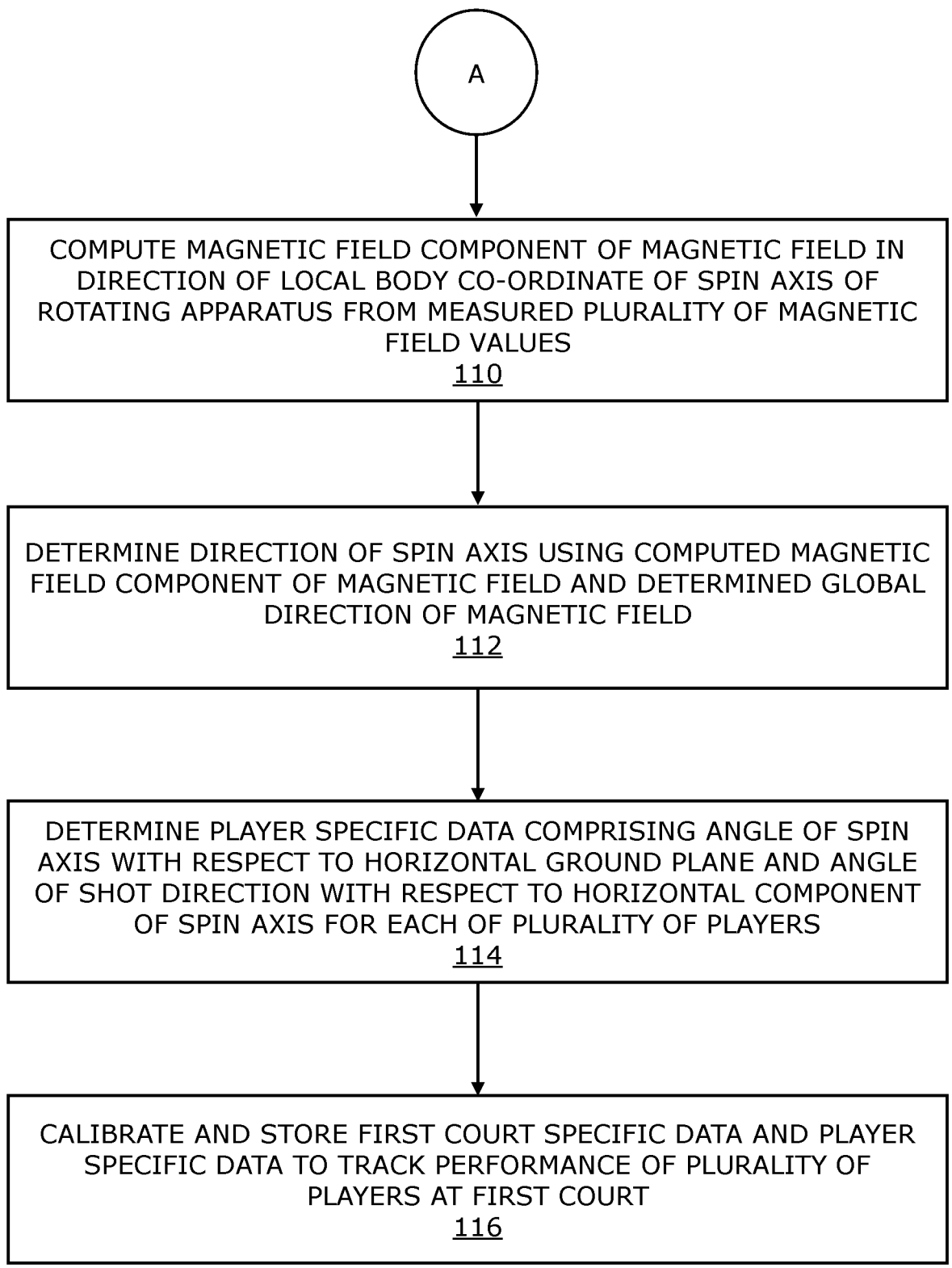

Referring to FIGS. 1A and 1B, there is shown a flowchart 100 illustrating steps of a method for tracking performance for a player, in accordance with an embodiment of the present disclosure. At step 102, a global direction of a magnetic field at a first court is determined and a first court specific data comprising a horizontal direction of a local magnetic field with respect to an x-axis of the global direction of the magnetic field and a vertical direction of the local magnetic field with respect to a local horizontal plane is computed. At step 104, a rotation for a rotating apparatus about a spin axis via a player, wherein the rotating apparatus comprising a XYZ-magnetic field sensor is provided. At step 106, the rotating apparatus is in a ballistic trajectory is determined and the XYZ magnetic field sensor is activated. At step 108, a plurality of magnetic field values as a function of time with the XYZ-magnetic field sensor when the rotating apparatus is rotating about the spin axis is measured. At step 110, a magnetic field component of the magnetic field in a direction of a local body co-ordinate of the spin axis of the rotating apparatus from the measured plurality of magnetic field values is computed. At step 112, a direction of the spin axis using the computed magnetic field component of the magnetic field and the determined global direction of the magnetic field is determined. At step 114, a player specific data comprising an angle of the spin axis with respect to the horizontal ground plane and an angle of the shot direction with respect to the horizontal component of spin axis for each of the player is determined. At step 116, the first court specific data and the player specific data to track the performance of the player at the first court are calibrated and stored.

Figure 2A:
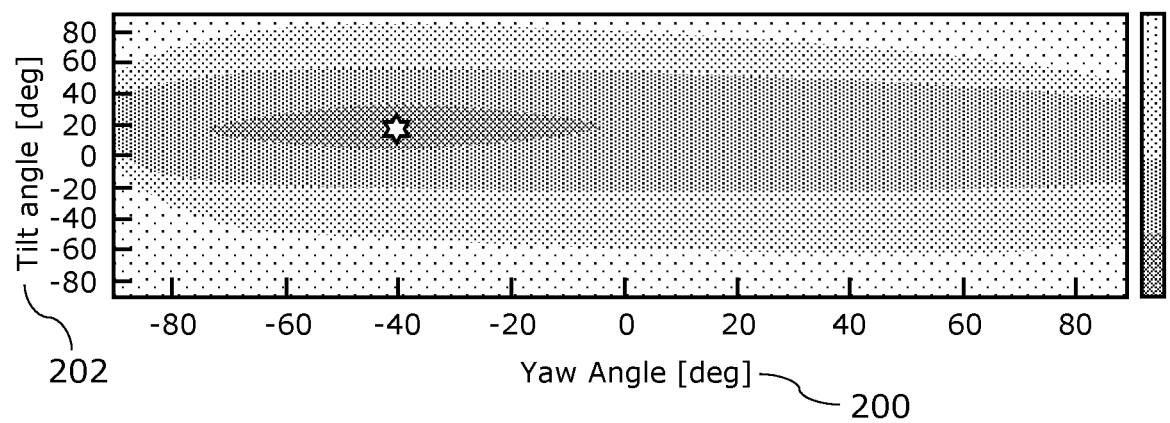
FIGS. 2A-2D collectively, are a schematic illustration of data collected for tracking performance of a player A, in accordance with an embodiment of the present disclosure.
Figure 2B:
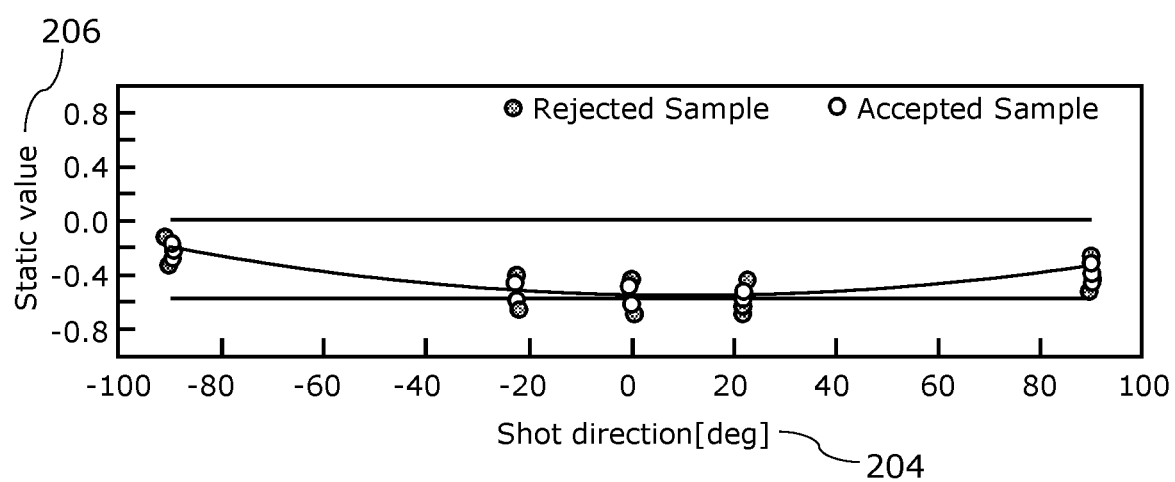
Figure 2C:
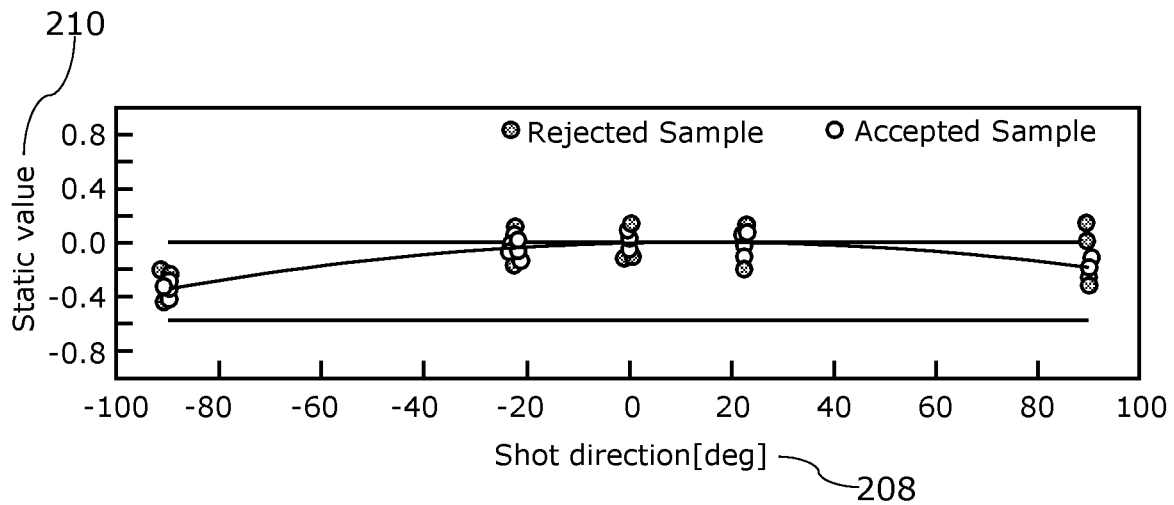
Figure 2D:
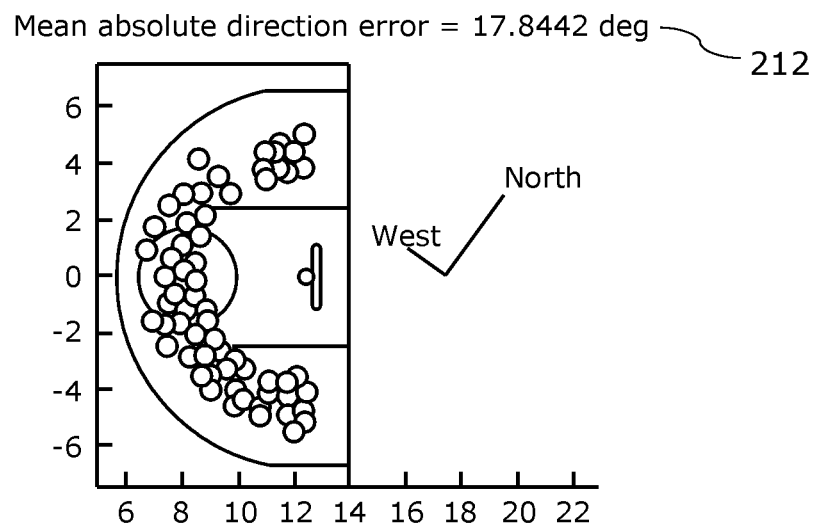

Referring to FIG. 2A-2D collectively, there is shown a schematic illustration of data collected for tracking the performance of a player A, in accordance with an embodiment of the present disclosure. Herein, FIG. 2A represents the heatmap of a yaw angle 200 against the tilt angle 202 for a player A over a number of shots taken by the player A with a rotating apparatus. Herein, FIG. 2B represents a graph for depicting a shot direction 204 with respect to a static value 206 for a first set of shots taken by the player A. Herein, FIG. 2C represents a graph for depicting a shot direction 208 with respect to a static value 210 for a second set of shots taken by the player A. Herein, FIG. 2D represents a graph for depicting a mean absolute direction error 212 for player A.

Figure 3A:
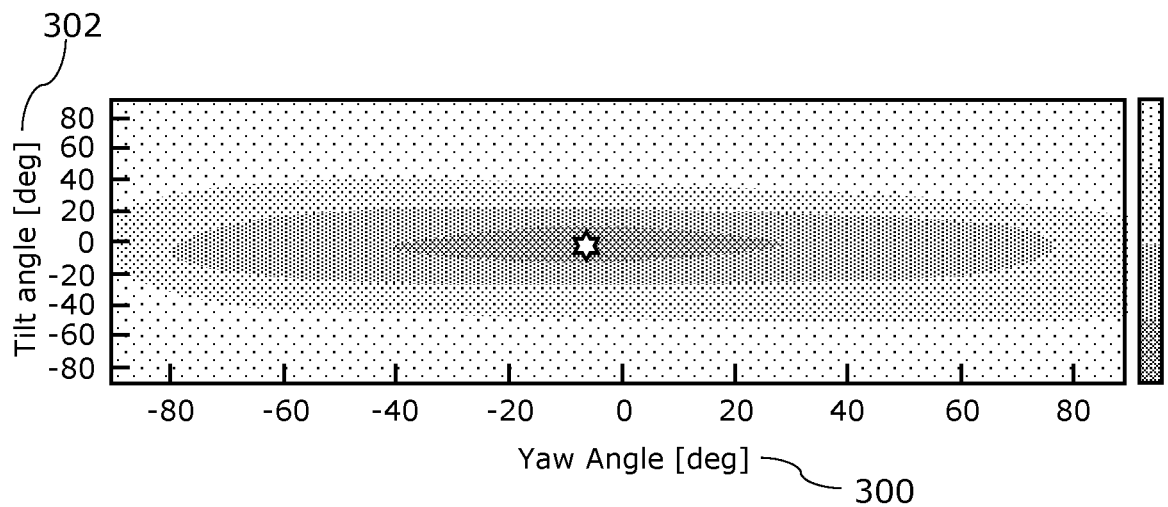
FIG. 3A-3D collectively, are a schematic illustration of data collected for tracking performance of a player B, in accordance with an embodiment of the present disclosure.
Figure 3B:
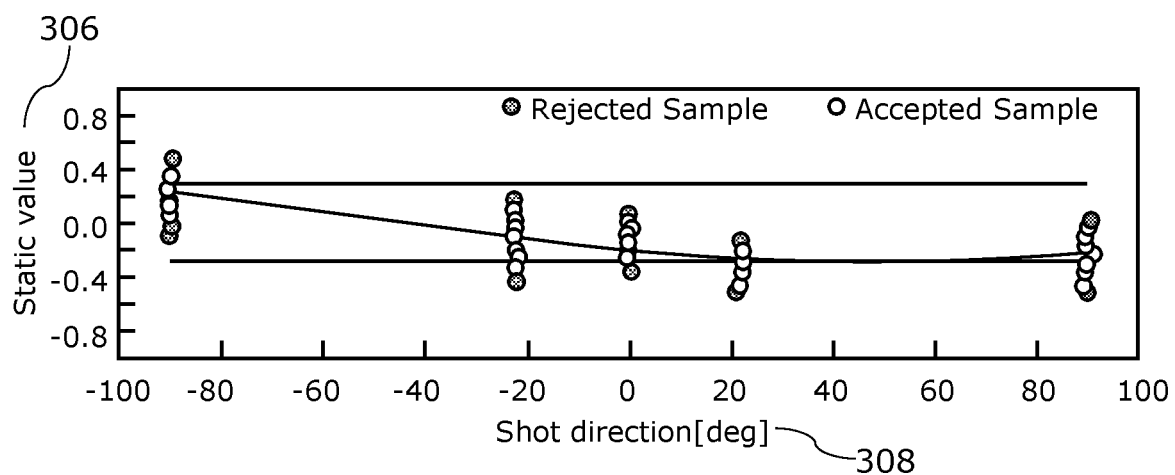
Figure 3C:
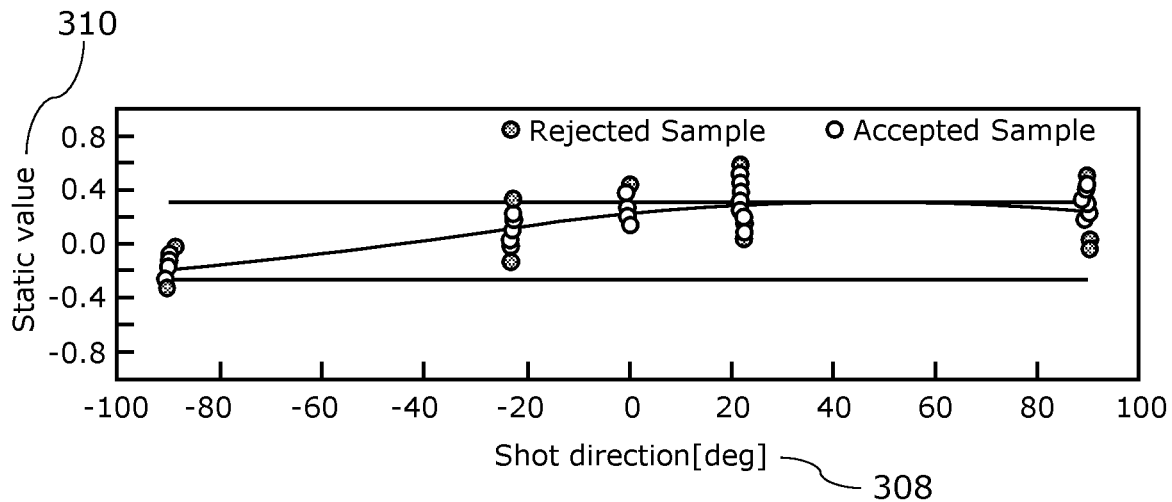
Figure 3D:
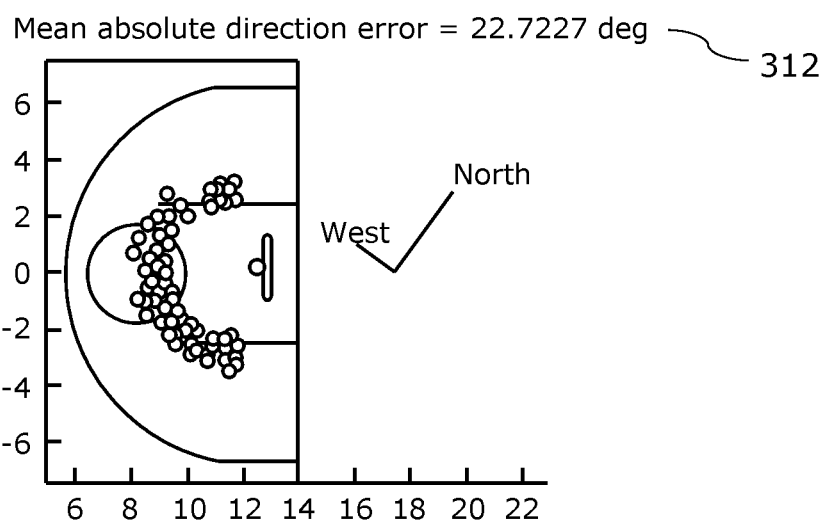

Referring to FIG. 3A-3D collectively, there is shown a schematic illustration of data collected for tracking the performance of a player B, in accordance with an embodiment of the present disclosure. Herein, FIG. 3A represents the heatmap of a yaw angle 300 against the tilt angle 302 for a player B over a number of shots taken by the player B with a rotating apparatus. Herein, FIG. 3B represents a graph for depicting a shot direction 304 with respect to a static value 306 for a first set of shots taken by the player B. Herein, FIG. 3C represents a graph for depicting a shot direction 308 with respect to a static value 310 for a second set of shots taken by the player B. Herein, FIG. 3D represents a graph for depicting a mean absolute direction error 312 for player B.

Figure 4:
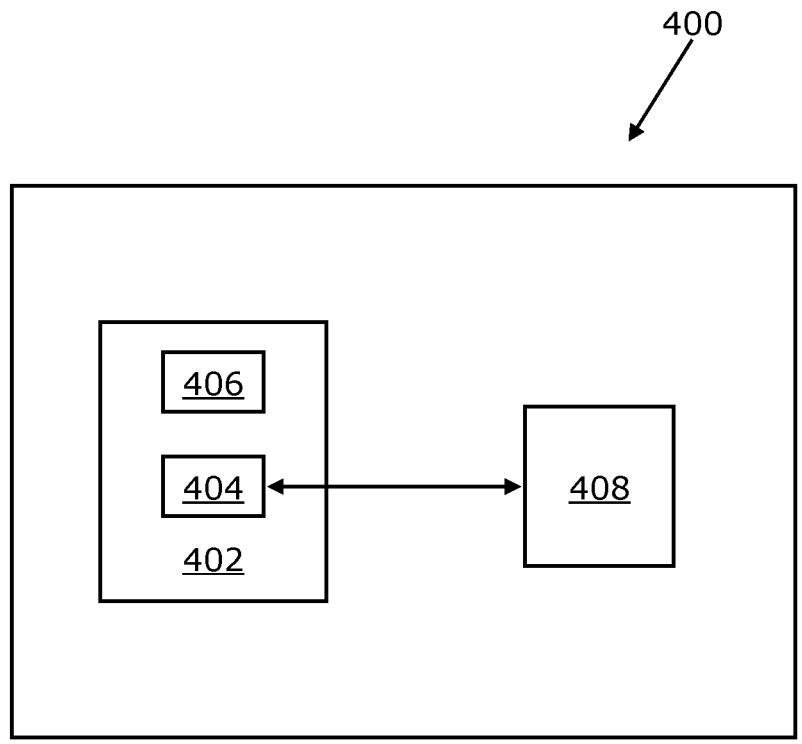
FIG. 4 is a schematic illustration of a system for tracking performance of a player, in accordance with an embodiment of the present disclosure.

Referring to FIG. 4, there is shown a schematic illustration of a system 400 for tracking performance of a player, in accordance with an embodiment of the present disclosure. Herein, the system 400 comprises a rotating apparatus 402. Herein, the rotating apparatus 402 comprises a communication module 404. Moreover, the rotating apparatus 402 comprises a XYZ magnet sensor 406. Furthermore, the system 400 comprises a processor 408 communicably coupled to the rotating apparatus 402 via the communication module 404.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method for tracking performance of a player, the method comprising:
    determining a global direction of a magnetic field at a first court and computing a first court specific data comprising a horizontal direction of a local magnetic field with respect to an x-axis of the global direction of the magnetic field and a vertical direction of the local magnetic field with respect to a local horizontal plane;
    providing a rotation for a rotating apparatus about a spin axis via a player, wherein the rotating apparatus comprises an XYZ-magnetic field sensor;
    determining that the rotating apparatus is in a ballistic trajectory and activating the XYZ magnetic field sensor;
    measuring a plurality of magnetic field values as a function of time with the XYZ-magnetic field sensor when the rotating apparatus is rotating about the spin axis;
    computing a magnetic field component of the magnetic field in a direction of a local body coordinate of the spin axis of the rotating apparatus from the measured plurality of magnetic field values;
    determining a direction of the spin axis using the computed magnetic field component of the magnetic field and the determined global direction of the magnetic field;
    determining a player specific data comprising an angle of the spin axis with respect to the horizontal ground plane and an angle of the shot direction with respect to the horizontal component of spin axis for the player;
    calibrating and storing the first court specific data and the player specific data to track the performance of the player at the first court;
    determining a global direction of a second magnetic field at a second court and computing a second court specific data comprising a horizontal direction of a local magnetic field with respect to an x-axis of the global direction of the second magnetic field and a vertical direction of the local magnetic field with respect to a local horizontal plane; and calibrating and storing the second court specific data and the stored player specific data to track the performance of the player at the second court.

2. The method according to claim 1, wherein the angle of the spin axis with respect to the horizontal ground plane is zero degrees and the angle of the shot direction with respect to the horizontal component of spin axis is 90 degrees.

3. The method according to claim 1, further comprising:
estimating a horizontal displacement of the rotating apparatus using at least one of a flight time, a release speed, an initial height, and a height of the rotating apparatus in respect to ground; and
determining a location of the rotating apparatus relative to a specified target by combining the direction of the spin axis of the rotating apparatus with the horizontal displacement.

4. A system for tracking performance of a player, the system comprising:
a rotating apparatus configured to be provided a rotation about the spin axis via a player, wherein the rotating apparatus comprises:
a communication module; and
an XYZ-magnetic field sensor configured to measure a plurality of magnetic field values as a function of time with the XYZ-magnetic field sensor when the rotating apparatus is rotating about the spin axis; and
a processor communicably coupled to the rotating apparatus, wherein the processor configured to:
determine a global direction of a magnetic field at a first court and compute first court specific data comprising a horizontal direction of a local magnetic field with respect to an x-axis of the global direction of the magnetic field and a vertical direction of the local magnetic field with respect to a local horizontal plane;
determine that the rotating apparatus is in a ballistic trajectory and activate the XYZ magnetic field sensor;
compute a magnetic field component of the magnetic field in a direction of a local body coordinate of the spin axis of the rotating apparatus from the measured plurality of magnetic field values;
determine a direction of the spin axis using the computed magnetic field component of the magnetic field and the determined global direction of the magnetic field;
determine a player specific data comprising an angle of the spin axis with respect to the horizontal ground plane and an angle of the shot direction with respect to the horizontal component of spin axis for the player;
calibrate and store the first court specific data and the player specific data to track the performance of the player at the first court;
determine a global direction of a second magnetic field at a second court and compute a second court specific data comprising a horizontal direction of a local magnetic field with respect to an x-axis of the global direction of the second magnetic field and a vertical direction of the local magnetic field with respect to a local horizontal plane; and
calibrate and store the second court specific data and the stored player specific data to track the performance of the player at the second court.

5. The system according to claim 4, wherein the angle of the spin axis with respect to the horizontal ground plane is zero degrees and the angle of the shot direction with respect to the horizontal component of spin axis is 90 degrees.

6. The system according to claim 4, wherein the processor is further configured to:
estimate a horizontal displacement of the rotating apparatus using at least one of a flight time, a release speed, an initial height, and a height of the rotating apparatus in respect to ground; and
determine a location of the rotating apparatus relative to a specified target by combining the direction of the spin axis of the rotating apparatus with the horizontal displacement.

* * * * *